United States Patent [19]

Miyazaki et al.

[11] Patent Number: 4,641,603
[45] Date of Patent: Feb. 10, 1987

[54] EPITAXIAL GROWING APPARATUS

[75] Inventors: Yoshihiko Miyazaki; Taizan Goto, both of Numazu; Yoshizo Komiyama; Kotei Iwata, both of Gotenba, all of Japan

[73] Assignee: Toshiba Kikai Kabushiki Kaisha, Tokyo, Japan

[21] Appl. No.: 554,824

[22] Filed: Feb. 21, 1984

[30] Foreign Application Priority Data

Nov. 1, 1983 [JP] Japan .................. 58-205194

[51] Int. Cl.$^4$ ............................. C23C 13/08
[52] U.S. Cl. .................... 118/724; 118/715; 118/733; 118/50
[58] Field of Search ............ 118/715, 724, 733, 50, 118/725; 220/215, 327, 328; 156/613, 614

[56] References Cited

U.S. PATENT DOCUMENTS 4,430,959  2/1984  Ebata et al. ............. 118/692 X
4,545,327  10/1985  Campbell et al. ............. 118/724 X

FOREIGN PATENT DOCUMENTS 56-124437  9/1981  Japan ................. 118/724
57-128021  9/1982  Japan .
58-6124    1/1983  Japan ................. 118/715
218262     9/1968  U.S.S.R. ............. 118/724

Primary Examiner—Richard Bueker
Attorney, Agent, or Firm—Koda and Androlia

[57] ABSTRACT

An epitaxial growing apparatus comprises a base plate, a quartz bell jar mounted on the base plate, and a reaction chamber defined by the base plate and the quartz bell jar, in which an epitaxial thin film layer of a semiconductor substance is formed on the substrate mounted on a support member. A metal bell jar is disposed outside the quartz bell jar so as to surround the quartz bell jar and a plurality of engaging members are operatively connected to the metal bell jar for detachably engaging the metal bell jar with the quartz bell jar.

10 Claims, 8 Drawing Figures

EPITAXIAL GROWING APPARATUS

BACKGROUND OF THE INVENTION

This invention relates to epitaxial growing apparatus for growing an epitaxial thin film layer of a semiconductor substance on a substrate mounted on a support member (suscepta) which is heated by high frequency energy or infrared radiation ray in a gas-tight reaction chamber, and more particularly, an improved construction of a base plate and a bell jar which define a gas-tight reaction chamber of an epitaxial growing apparatus.

Typical conventional epitaxial growing apparatus are shown in FIGS. 1 and 2, which particularly represent vertical type (so-called pancake type) epitaxial growing apparatus. Referring to FIG. 1, a bell jar 3 made of quartz (quartz bell jar, called hereinbelow) is mounted on a base plate 1, which generally comprises a stainless steel plate, through a seal member 2 such as an O-ring. The quartz bell jar 3 and the base plate 1 define a gas-tight reaction chamber 4 therebetween, in which a nozzle member 7 extends vertically through the base plate 1 and a support member 5 on which substrates 6 are mounted is rotatably arranged around the nozzle 7. The support member 5 is heated by a high frequency induction heating coil 8 located below the support member 5 and gas exhaust pipes 9 are connected to the base plate 1. A clean bench 10 is located to surround the epitaxial growing apparatus. Since the reaction chamber 4 is defined by the bell jar 3 made of quartz, radiant heat from the support member 5 is dispersed outwardly through the quartz bell jar 3, so that a good thermal efficiency cannot be attained and the dispersed heat is dangerous for workers. In addition, the quartz bell jar 3 is itself apt to be easily broken by an accidental external impact.

Moreover, with the conventional epitaxial growing apparatus of the type described above, it is obliged to cool the side panel of the clean bench 10 arranged to surround the apparatus for the purpose that the clean bench 10 is heated to a relatively high temperature by the radiant heat through the quartz bell jar 3.

FIG. 2 also shows a conventional epitaxial growing apparatus in which a stainless steel made bell jar 11 is mounted on the base plate 1. A quartz bell jar 14 is located inside the stainless steel bell jar 11 and supported by a plurality of (preferably more than three) screw type support pieces 13 secured to the lower peripheral end of the stainless steel bell jar 11 (FIG. 2a) and cooling pipes 12 are arranged on the outer surface of the stainless steel bell jar 11 to prevent the radiant heat from dispersing outwardly of the stainless steel bell jar 11. Thus, the defects of the epitaxial growing apparatus shown in FIG. 1 could be obviated by the apparatus shown in FIG. 2. However, with the epitaxial growing apparatus shown in FIG. 2, since a space between the quartz bell jar 14 and the stainless steel bell jar 11 communicates with the reaction chamber 4, because the former bell jar 14 is supported at several portions to the latter bell jar 11 by the support pieces 13, a reaction gas supplied in the chamber 4 from the nozzle 7 flows into this space, thus forming undesired reaction substances therein. In order to avoid this defect, the stainless steel bell jar 11 is provided with a port 15 through which a purge gas such as hydrogen gas with high purity should be supplied in the space during the operation of the epitaxial growing apparatus. Thus, the conventional epitaxial growing apparatus shown in FIG. 2 will also be considered not to be a satisfied apparatus.

SUMMARY OF THE INVENTION

An object of this invention is to obviate defects encountered in the prior art epitaxial growing apparatus and to provide an improved epitaxial growing apparatus including a quartz bell jar and a metal bell jar which is engagable with the quartz bell jar by engaging members.

According to this invention there is provided an epitaxial growing apparatus of the type in which an epitaxial thin film layer of a semiconductor substance is formed on a substrate mounted on a support member disposed in a sealed reaction chamber and the apparatus comprises a base plate, a quartz bell jar mounted on the base plate to define the reaction chamber therebetween, a metal bell jar disposed outside the quartz bell jar so as to surround the same, and an engaging member operatively connected to the metal bell jar for detachably engaging the metal bell jar with the quartz bell jar.

DESCRIPTION OF THE PREFERRED EMBODIMENTS

Figure 1:
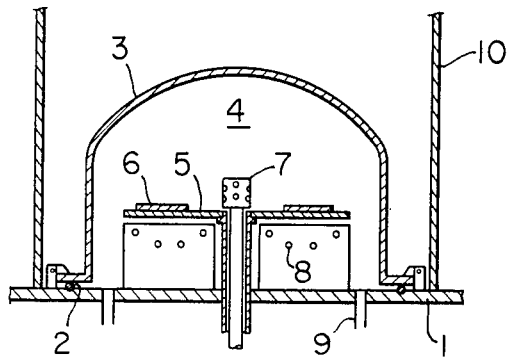
FIGS. 1 and 2 are vertical sectional views showing conventional epitaxial growing apparatus.
Figure 2:
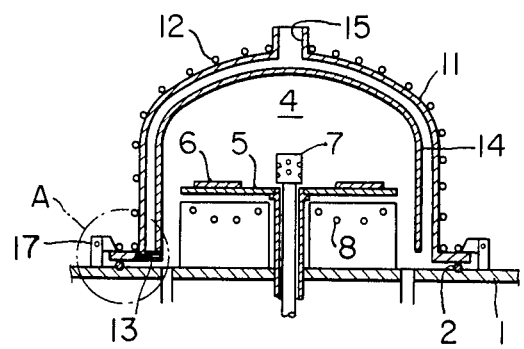
Figure 2A:
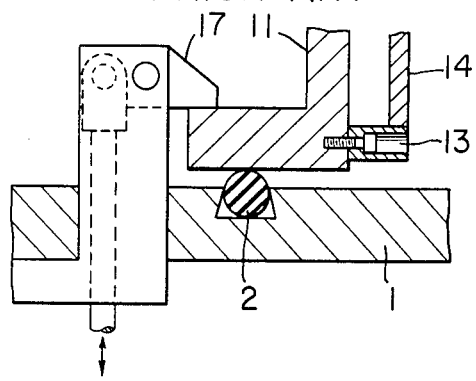
FIG. 2a is an enlarged view of an encircled portion A of FIG. 2.
Figure 3:
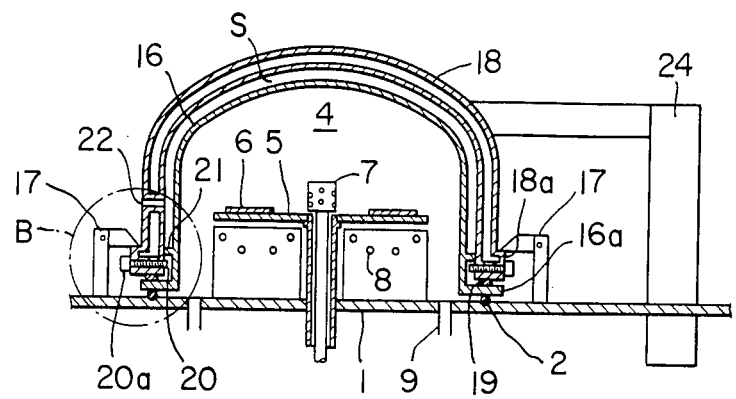
FIG. 3 is a vertical sectional view showing one embodiment of epitaxial growing apparatus according to this invention.

Referring to FIG. 3 in which one embodiment of an epitaxial growing apparatus according to this invention is shown and like reference numerals are applied to elements corresponding to those shown in FIGS. 1 and 2, a quartz bell jar 16 provided with a flanged lower end 16a is mounted on the base plate 1 through an O-ring 2 to thereby define a gas-tight reaction chamber 4 therebetween. The quartz bell jar 16 is surrounded by a double structured metal, such as preferably stainless steel, bell jar 18. The metal bell jar 18 can be cooled by passing a cooling water between a space defined by its double structure. The inside surface of the metal bell jar 18 is finished by fine surface grinding or infrared ray reflection film coating for the surface to minimize heat loss due to absorption of the radiant heat. The metal bell jar 18 is provided with a flanged lower end 18a which is mounted on the flange portion 16a of the quartz bell jar 16 through an interposed resilient member 19 such as spring or O-ring.

Figure 3A:
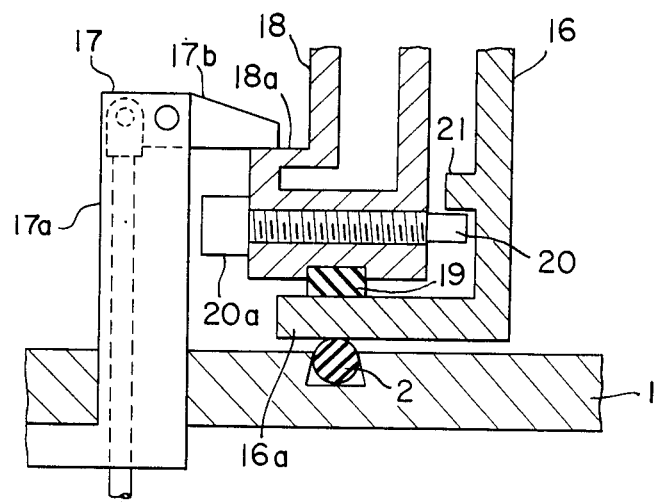
FIG. 3a is an enlarged view of an encircled portion B of FIG. 3.

A plurality of engaging members 20 of generally screw type, each having a handle portion 20a, are attached at circumferential several portions of the flange portion 18a of the metal flange 18 so that the engaging members 20 can be engaged with or disengaged from projections 21 formed on the outer peripheral surface of the quartz bell jar 16 by moving forwardly or backwardly the engaging members 20. The details of this engaging condition of the engaging member 20 are shown in FIG. 3a. Alternatively, recesses can be formed on the quartz bell jar 16 in place of the projections 21. Under the engaged condition, the quartz bell jar 16 can be moved or elevated together with the metal bell jar 18 when the latter is moved or elevated. A plurality of passages 22 are formed on the peripheral surface of the metal bell jar 18 so as to connect the space between the both bell jars 16 and 18 to surrounding atmosphere.

A plurality of clamping members 17 are disposed on the base plate 1, and as shown in detail in FIG. 3a, each of the clamping members 17 comprises two parts, one being a vertical portion 17a having a lower end secured to the base plate 1 and the other being a horizontal portion 17b having a rear end connected to the upper end of the vertical portion 17a to be pivotable thereabout by such as hinge means and operated by a hydraulic means. The horizontal portion 17b of the clamping member 17 is engaged with or disengaged from the upper surface of the flange portion 18a of the metal bell jar 18 by rotating the horizontal portion 17a. Under the engaged and clamped condition, the quartz bell jar 16 is pressed downwardly towards the base plate 1 through the flange portion 18a and the resilient member 19 to completely seal the reaction chamber 4.

The operation of the epitaxial growing apparatus shown in FIG. 3 will be described hereunder.

When it is required to disassemble the epitaxial growing apparatus, the clamping member 17 are first disengaged from the upper surface of the flange portion 18a of the metal bell jar 18, which is then lifted by an elevating device connected to the metal bell jar 18, for example hydraulic cylinder means briefly designated by reference numeral 24. During this operation, the engaging members 20 engage with the lower surfaces of the projections 21 of the quartz bell jar 16 to thereby lift the quartz bell jar 16 together with the metal bell jar 18, thus the reaction chamber 4 being opened. After the loading or unloading of the substrates 6 on the supporting member 5, the metal bell jar 18 is lowered by driving the elevating device 24 with the quartz bell jar 16 and settled on the base plate 1. The clamping members 17 are then operated to engage with and downwardly clamp the flange portion 18a of the metal bell jar 18 through the resilient member 19 and the O-ring 2. Since the quartz bell jar 16 is downwardly pressed through the interposed resilient member 19, it can be relatively equally pressed at every circumferential portion even if the flange portion 16a is not evenly formed. The reaction chamber 4 can thus be completely gas-tightly sealed, so that a reaction gas or purge gas ejected from the nozzle 7 does not leak out from the reaction chamber 4 into atmosphere as well as into the space S between the quartz bell jar 16 and the metal bell jar 18. It is therefore not necessary to supply a purge gas into this space S, and the inside surface of the metal bell jar 18 and the outside surface of the quartz bell jar 16 can be completely prevented from being tarnished. Coating with an infrared ray reflection film or fine grinding of the inside surface of the metal bell jar 18 ensures good reflecting efficiency to the radiant heat for a long time.

The location of the metal bell jar 18 outside of the quartz bell jar 16 protects the latter bell jar, and in addition, the temperature rising of surrounding atmosphere can be prevented by flowing cooling water in the metal bell jar 18. Swelling or contraction of air in the space S caused by the temperature variation in the reaction chamber 4 can be suppressed by the provision of the passages 22 which connect the space S to the surrounding atmosphere.

When it is required to exchange or clean the quartz bell jar 16, the metal bell jar 18 is disassembled from the quartz bell jar 16 by retracting the engaging members 20 by operating their handle portions 20a to disengage the members 20 from the projections 21 of the quartz bell jar 16 and then lifting the metal bell jar 18. Thus, only the metal bell jar 18 can easily and safely be lifted and the quartz bell jar 16 can easily be exchanged or cleaned. This operation can be done after the bell jars 16 and 18 under engaged condition were first replaced on another base plate, not shown.

Figure 4:
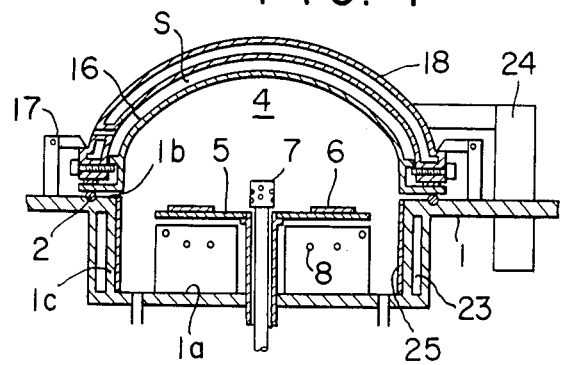
FIG. 4 is a vertical sectional view showing another embodiment of the epitaxial growing apparatus according to this invention.

FIG. 4 shows another embodiment of an epitaxial growing apparatus of this invention, in which the base plate 1 is constructed to have a recessed portion 1a having a depth substantially equal to the height of the support member 5 in the reaction chamber 4 and the quartz bell jar 16 is settled on the base plate 1 at the edge portion 1b of the recess 1a through the seal member 2. The recessed portion 1a constitutes a bottom of the reaction chamber 4. According to this embodiment, since the bell jars 16 and 18 can be constructed to have a height lower than that shown in FIG. 3, the lifting amount of the bell jars can be reduced at loading or unloading of the substrates 6 on the support member 5 in the reaction chamber 4. Of course, the depth of the recess 1a can optionally be determined by taking into consideration possibilities of the cleaning of the inside of the recess 1a or of the control or adjustment of the heating coil 8. A cooling jacket 23 can be located to the wall portion 1c of the recess 1a and a quartz or metal cylindrical member 25 is detachably attached to the wall portion 1c for preventing deposition of undesired substance due to the reaction gas on the wall portion 1c.

Figure 5:
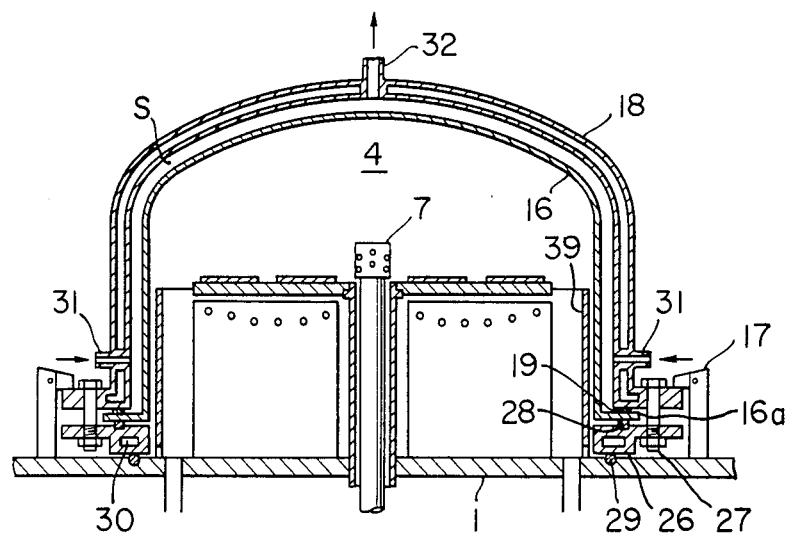
FIG. 5 is also a vertical sectional view showing a further embodiment of the epitaxial growing apparatus according to this invention.

FIG. 5 shows a further embodiment of an epitaxial growing apparatus according to this invention, in which like reference numerals are applied to elements corresponding to those shown in FIGS. 1 through 4. In FIG. 5, a ring-like member 26 made of a metal such as stainless steel is gas-tightly located on the lower surface of the flange portion 16a of the quartz bell jar 16 through a seal member 28. The ring member 26 is detachably secured to the flange portion 18a of the metal bell jar 18 by a plurality of bolts 27, for example, at several circumferential portions of the metal bell jar 18. Thus, the flange portion 16a, i.e. the quartz bell jar 16 can be gas-tightly clamped between the ring member 26 and the flange portion 18a of the metal bell jar through the interposed resilient member 19 and a seal member 28. A seal member 29, preferably an O-ring, is disposed between the ring member 26 and the base plate 1. A plurality of clamping members 17 are secured to the base plate 1 to clamp and press downwardly the flange portion 18a of the metal bell jar 18 to thereby gas-tightly seal the reaction chamber 4.

According to the embodiment shown in FIG. 5, when it is required in a usual operation to open the reaction chamber 4, the metal bell jar 18 is lifted together with the quartz bell jar 16 and at this time the ring member 26 is also lifted with the seal member 28 interposed between the ring member 26 and the flange portion 16a of the quartz bell jar 16, so that the seal member 28 is less damaged by the heat and the gas-tight condition can safely be maintained for a long time even in frequent opening or closing of the bell jars. The seal member 29 can positively be cooled by flowing a cooling liquid in a passage 30, for example, formed in the metal made ring member 26, thus preventing the seal member 29 from adhering to the ring member 26 by undesired thermal effect. In order to more safely guard the seal members 28 and 29, a metal or ceramic cylindrical shielding member 39 may be located inside the quartz bell jar 16 on the base plate 1 to prevent the seal members or lower portion of the quartz bell jar from being overheated by the radiant heat. The shielding member 39 is provided with several notches at its lower edge between the base plate 1 for freely flowing heated reaction gas outside the shielding member 39 into the space surrounded by the shielding member 39 through these notches.

The metal bell jar 18 may be provided with gas flow-in ports 31 and gas flow-out port 32 at the outer periphery thereof for circulating a cooling gas such as nitrogen ($N_2$) gas or air in the space S between the both bell jars 16 and 18 to effectively cool the quartz bell jar 16. It is better to utilize the $N_2$ gas than air as a cooling gas to prevent explosion in case of accidental breaking of the quartz bell jar during the operation of the epitaxial growing apparatus because hydrogen gas is generally used as a carrier gas for the reaction gas ejected from the nozzle 7. In the epitaxial growing apparatus shown in FIG. 5, differing from the apparatus shown in FIG. 2, the space S between the bell jars 16 and 18 is not communicated with the interior of the reaction chamber 4, so that the cooling gas, $N_2$ gas or air, with relatively low purity can be economically utilized. In addition, since the cooling gas flow is not influenced with the flow of the reaction gas in the reaction chamber 4, the amount of the cooling gas can be freely adjusted in accordance with desired cooling degree and the temperature rising of the quartz bell jar 16 is effectively suppressed to a low temperature. The deposition of undesirable reaction substances on the inner surface of the quartz bell jar 16 can also be prevented effectively. In the embodiment illustrated in FIG. 5, the gas flow-in ports 31 and the gas flow-out port 32 are disposed respectively at the relatively low and relatively high positions of the outer periphery of the quartz bell jar 16 for preventing the seal member 28 from adhering to the quartz bell jar 16 and preventing the quartz bell jar 16 from being broken by heat. However, the other example, not shown, the gas flow-in port may be disposed on the relatively high position of the quartz bell jar 16 and the gas flow-out port may be disposed at a relatively low position thereof in a case where it is positively required to prevent the reaction substance from depositing on the relatively high position on the inside surface of the quartz bell jar in accordance with the type of the used reaction gas for the reaction such that the reaction substance is apt to be deposited on the upper portion of the inside surface of the quartz bell jar. Furthermore, the gas flow-in ports may be disposed on the relatively high and low positions on the quartz bell jar and the gas flow-out port may be disposed at the intermediate portion between the upper and lower gas flow-in ports to attain the effects described with respect to the foregoing examples. As described above, the numbers or positions of the gas flow-in and -out ports can be optionally selected as occasion demands regardless of the reaction gas flow in the reaction chamber.

The gas flow-in and -out ports 31 and 32 and shielding member 39 may be preferably applied to the embodiment described hereinbefore and the base plate described with reference to FIG. 4 can also be applied to the embodiment shown in FIG. 5. In addition, in the foregoing embodiments, the base plate 1 is constructed by one member, but it can be constructed gas-tightly by several members, particularly with the embodiment of the type shown in FIG. 4.

Figure 6:
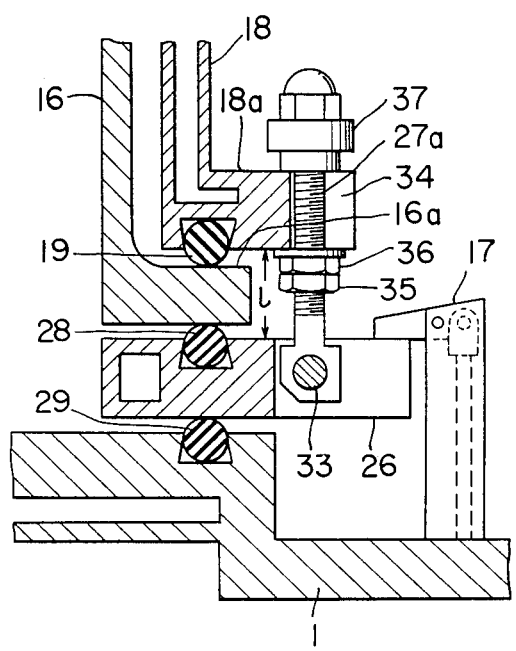
FIG. 6 is a partial enlarged vertical sectional view showing one example of an engaging member connecting a ring member to a metal bell jar according to this invention.

FIG. 6 is an enlarged partial view showing another example of an engaging or connecting mechanism between the ring member 26 and the metal bell jar 18 shown in FIG. 5, in which a bolt 27a is attached to the ring member 26 by a pin 33 to be pivotable thereabout. A groove 34 is formed on the flange portion 18a of the metal bell jar 18 so as to receive the upper portion of the bolt 27a. A distance l between the upper portion of the ring member 26 and the lower portion of the flange portion 18a of the metal bell jar 18 is preliminarily set by securing nut means 35 and 36 on the bolt 27a to a position suitable for effectively attaining sealing condition of the seal member 28. After the nut means 35 and 36 have been set, that is, the distance l has been set, a nut 37 engaged with the upper portion of the bolt 27a is screwed to clamp the flange portion 18a of the metal bell jar 18 between the nuts 36 and 37. A spacer can be alternatively interposed between the ring member 26 and the metal bell jar 18 without using such bolt-nut means as described above for predetermining the distance l. By preliminarily setting the distance between the ring member 26 and the metal bell jar 18, the flange portion 16a of the quartz bell jar 16 and the seal member 28 can be prevented from being broken or undesirably deformed by the weight of the metal bell jar 18. In case of using the connecting mechanism shown in FIG. 6, the clamping members 17 can be engaged with the upper surface of the ring member 26 to downwardly press the same to effectively attain the sealing effect of the quartz bell jar 16. Of course the connecting mechanism such as bolt means 27a is disposed at several circumferential portions of the flange portion 18a of the metal bell jar 18.

What is claimed is:

1. An epitaxial growing apparatus for the type in which an epitaxial thin film layer of a seminconductor substance is formed on a substrate mounted on a support member disposed in a sealed reaction chamber, comprising:
    a base plate;
    a quartz bell jar mounted on said base plate to define the reaction chamber therebetween;
    a metal bell jar disposed outside said quartz bell jar so as to surround the same; and
    an engaging member operatively connected to said metal bell jar for detachably engaging said metal bell jar with said quartz bell jar;
    said quartz bell jar being provided with a flange portion of the lower end thereof, which is to be pressed downwardly towards said base plate by said metal bell jar through a resilient member interposed therebetween.

2. The epitaxial growing apparatus according to claim 1 wherein a cylindical shielding member is located on the base plate inside said quartz bell jar.

3. The epitaxial growing apparatus according to claim 1 wherein said engaging member is movably attached to said metal bell jar so that said engaging member projects over the inside surface of said metal bell jar and the projected end can be engaged with a projection formed on the outer surface of said quartz bell jar.

4. The epitaxial growing apparatus according to claim 1 wherein said engaging member is a ring member located on the lower surface of the flange portion of said quartz bell jar and detachably connected to said metal bell jar through the flange portion of said quartz bell jar to gas-tightly clamp it therebetween so that a reaction chamber is defined by said base plate and said quartz bell jar through said ring member.

5. The epitaxial growing apparatus according to claim 4 wherein said metal bell jar and said ring member are mutually fixed through a spacer member so as to have a predetermined distance therebetween suitable for maintaining sealing condition of a seal member disposed between said ring member and said flange portion of said quartz bell jar.

6. The epitaxial growing apparatus according to claim 5 wherein said ring member is downwardly pressed towards said base plate through a seal member to define a sealed reaction chamber.

7. The epitaxial growing apparatus according to claim 4 wherein said ring member is provided with inner passage means through which a cooling liquid flows.

8. The epitaxial growing apparatus according to claim 1 wherein at least one flow-in port and at least one flow-out port are provided on the peripheral surface of said metal bell jar for circulating a cooling gas in a space between said metal and quartz bell jars to cool said quartz bell jar.

9. The epitaxial growing apparatus according to claim 1 wherein said base plate has a recessed portion which constitutes a bottom of said reaction chamber and said quartz bell jar is mounted on said base plate at the edge portion of said recessed portion.

10. The epitaxial growing apparatus according to claim 9 wherein a cylindrical protecting member is detachably attached to a side wall of said recessed portion.

* * * * *